United States Patent
Di et al.

(10) Patent No.: US 10,804,903 B1
(45) Date of Patent: Oct. 13, 2020

(54) ASYNCHRONOUS CIRCUIT STACKING FOR SIMPLIFIED POWER MANAGEMENT

(71) Applicants: Jia Di, Fayetteville, AR (US); Andrew Lloyd Suchanek, Albuquerque, NM (US); Zhong Chen, Fayetteville, AR (US); Matthew Leftwich, Fayetteville, AR (US)

(72) Inventors: Jia Di, Fayetteville, AR (US); Andrew Lloyd Suchanek, Albuquerque, NM (US); Zhong Chen, Fayetteville, AR (US); Matthew Leftwich, Fayetteville, AR (US)

(*) Notice: Subject to any disclaimer, the term of this patent is extended or adjusted under 35 U.S.C. 154(b) by 0 days.

(21) Appl. No.: 16/684,961

(22) Filed: Nov. 15, 2019

Related U.S. Application Data

(60) Provisional application No. 62/768,233, filed on Nov. 16, 2018.

(51) Int. Cl.
*H03K 19/17784* (2020.01)
*H03K 19/17788* (2020.01)
*H03K 19/08* (2006.01)

(52) U.S. Cl.
CPC .. *H03K 19/17784* (2013.01); *H03K 19/17788* (2013.01); *H03K 19/0813* (2013.01)

(58) Field of Classification Search
None
See application file for complete search history.

(56) References Cited

U.S. PATENT DOCUMENTS

| | | | | |
|---|---|---|---|---|
| 5,640,105 | A * | 6/1997 | Sobelman | G06F 5/08 326/121 |
| 6,208,171 | B1 * | 3/2001 | Kumagai | H03K 19/0016 326/121 |
| 6,696,852 | B1 * | 2/2004 | Brunolli | H04L 25/0276 326/30 |
| 7,977,972 | B2 | 7/2011 | Di et al. | 326/46 |
| 8,207,758 | B2 | 6/2012 | Di et al. | 326/120 |
| 8,664,977 | B2 | 3/2014 | Di et al. | 326/121 |
| 9,083,337 | B2 | 7/2015 | Smith et al. | 326/98 |
| 9,094,013 | B2 | 7/2015 | Smith et al. | 326/46 |
| 10,418,076 | B2 * | 9/2019 | Meinerzhagen | G11C 5/148 |

OTHER PUBLICATIONS

Jeff Falin. "Powering today's multi-rail FPGAs and DSPs, Part 1," Analog Applications Journal (1Q 2006).
D. Kilani, B. Mohammad, H. Saleh and M. Ismail, "LDO regulator versus switched inductor DC-DC converter," 2014 21st IEEE International Conference on Electronics, Circuits and Systems (ICECS), Marseille, 2014, pp. 638-641.
(Continued)

*Primary Examiner* — Minh D A
*Assistant Examiner* — James H Cho
(74) *Attorney, Agent, or Firm* — Keisling & Pierper PLC; David B. Pieper

(57) ABSTRACT

A circuit stacking multiple asynchronous circuit components, specifically Multi-Threshold NULL Convention Logic (MTNCL) circuit components, with an overall power supply equal to the multiples of the original VDD.

4 Claims, 11 Drawing Sheets

(56) References Cited

OTHER PUBLICATIONS

X. Mi, D. Mandal, V. Sathe, B. Bakkologlu and J. Seo, "Fully-integrated switched capacitor voltage regulator with on-chip current-sensing and workload optimization in 32mm SOI CMOS," 2015 IEEE/ACM International Symposium on Low Power Electronics and Design (ISLPED), Rome, 2015, pp. 140-145.
Sae Kyu Lee, David Brooks, and Gu-Yeon Wei. 2012. Evaluation of voltage stacking for near-threshold multicore computing. In Proceedings of the 2012 ACM/IEEE international symposium on Low power electronics and design (ISLPED '12). ACM, New York, NY, USA, 373-378.
K. M. Fant and S. A. Brandt, "NULL Convention Logic: A Complete and Consistent Logic for Asynchronous Digital Circuit Synthesis," International Conference on Application Specific Systems, Architectures, and Processors, 1996.
S. C. Smith and J. Di, Designing Asynchronous Circuits using NULL Convention Logic (NCL), Morgan & Claypool Publishers, 2009.

\* cited by examiner

ASYNCHRONOUS CIRCUIT STACKING FOR SIMPLIFIED POWER MANAGEMENT

CROSS-REFERENCE TO RELATED APPLICATIONS

This application claims priority to and is a continuation-in-part of U.S. Provisional Application Ser. No. 62/768,233 filed on Nov. 16, 2018. This prior application is incorporated by reference in its entirety.

STATEMENT REGARDING FEDERALLY SPONSORED RESEARCH OR DEVELOPMENT

Not Applicable.

REFERENCE TO A MICROFICHE APPENDIX

Not Applicable.

RESERVATION OF RIGHTS

A portion of the disclosure of this patent document contains material which is subject to intellectual property rights such as but not limited to copyright, trademark, and/or trade dress protection. The owner has no objection to the facsimile reproduction by anyone of the patent document or the patent disclosure as it appears in the Patent and Trademark Office patent files or records but otherwise reserves all rights whatsoever.

BACKGROUND OF THE INVENTION

1. Field of the Invention

The present invention relates to improvements in electrical circuit components. More particularly, the invention relates to improvements particularly suited for stacking multiple asynchronous circuit components. In particular, the present invention relates specifically to Multi-Threshold NULL Convention Logic (MTNCL) circuit components, on top of each other, with an overall power supply equal to the multiples of the original supply voltage VDD, thereby reducing the number of voltage converters needed, which in turn simplifies the power management design and saves power loss during voltage conversion.

2. Description of the Known Art

As will be appreciated by those skilled in the art, electrical circuits are known in various forms. Patents disclosing information relevant to MTNCL circuits include: U.S. Pat. No. 9,094,013, issued to Smith, et al. on Jul. 28, 2015 entitled Single component sleep-convention logic (SCL) modules; U.S. Pat. No. 9,083,337, issued to Smith, et al. on Jul. 14, 2015 entitled Multi-threshold sleep convention logic without nsleep; U.S. Pat. No. 8,664,977, issued to Di, et al. on Mar. 4, 2014 entitled Ultra-low power multi-threshold asynchronous circuit design; U.S. Pat. No. 8,207,758, issued to Di, et al. on Jun. 26, 2012 entitled Ultra-low power multi-threshold asynchronous circuit design; and U.S. Pat. No. 7,977,972, issued to Di, et al. on Jul. 12, 2011 entitled Ultra-low power multi-threshold asynchronous circuit design. Each of these patents is hereby expressly incorporated by reference in their entirety.

For many power-sensitive applications such as battery-powered Internet-of-Things (IoT) devices, more and more functions are being added to improve the capability, connectivity, and effectiveness for end users. Therefore, battery-powered electronics typically incorporate more than one digital integrated circuit (IC) for data processing, control, and communication. Although the battery life of IoT devices can be extended with the help of external power sources (e.g., wireless charging or energy harvesting), it is essentially determined by a) the power management scheme in the device, which delivers specific voltage supplies to all circuit components, and b) power consumption and power loss of the circuits fed by the battery. As multiple digital circuit components with different technology nodes are implemented within a single system to perform various functions, the power management unit and the power supply rails have become increasingly complex.

Even within a single digital IC, different voltage supplies are typically required for core devices, auxiliary devices, and input/output (I/O) pads. For example, a field-programmable gate array (FPGA) can easily have ten or more power rails to support the device core, memory, internal buffers and external I/O such as $I^2C$, SPI, and other pads. These rails may have different voltages such as 0.9V, 1.2V and 1.5V [1]. Similarly, an application-specific IC (ASIC) such as a Wi-Fi communication IC may have multiple power rails to support internal functions as well as interface voltages required by an industry standard. In addition, the voltage differences between these power rails are increasing, according to the fact that the voltage for core devices keeps reducing due to the scaling of the semiconductor technology. As a result, the power management unit (PMU) design becomes more and more challenging.

Since an electronic device usually contains a single power source (e.g., battery), voltage converters are incorporated to produce various supply voltages (VDD) needed for these power rails. The state-of-the-art designs of on-chip voltage converters are able to yield an efficiency (i.e., its output power divided by the input power) between 60% to 82%, based on the load [2-3]. Even in the best case for on-chip buck converters, 18% of supplied power will be lost during a single voltage conversion. Considering the number of voltage converters needed for a system consisting of multiple power rails, a significant amount of power loss will occur.

Current academic research and industry practices in solving the abovementioned problems typically focus on fine-tuning the power converters themselves. On the other hand, if the root cause of these problems, i.e., the need for multiple voltage supplies, can be alleviated or even eliminated, such solution will be much more efficient and effective. Circuit stacking, originally introduced in [4], is a promising effort toward this goal. As shown in FIG. 1, circuit stacking is to reduce the number of power rails required by stacking multiple independent digital circuit components on top of each other and only supplying the multiples of VDD to the entire stack (FIG. 1 shows a 2-stack diagram). There are several immediate benefits with this circuit stacking approach: 1) savings of power loss in voltage conversion—when fewer power rails are needed, the power loss during power conversion for these power rails is saved; 2) reduction of voltage regulators needed—the number of on-chip or off-chip power converters is reduced due to the fewer power supplies in the system; 3) reduction of power management complexity—less power sequencing issues in the power supply designs with reduced number of supplies; and 4) no conflict with existing power reduction techniques—circuit stacking is at the architecture-level and does not alter the circuit design. Therefore, all state-of-the-art power reduction techniques can still be applied to further reduce the power consumption.

However, stacking circuits in a naïve manner does not work. Even for stacked identical circuit copies, it is impossible to guarantee that both circuits operate exactly the same at all times. Therefore, the unbalanced switching activities between the two circuits will cause the voltage at the middle node in FIG. 1 to fluctuate around VDD. This situation is made worse if stacking circuits of different sizes or if one of the circuits is idle while the other one keeps working. Such fluctuations will change the dynamic ranges (i.e., the voltage potential across this circuit block) of both circuits in real time and in turn pose a considerable impact on their gate delays and operating speed. Due to the strict timing requirements in a clocked synchronous circuit (e.g., setup time and hold time), the changes in delays will induce timing violations and circuit malfunction. Therefore, a novel circuit stacking architecture is needed before this technology can be adopted by industry for simplifying the design of power management units.

Additional articles for consideration include:
1. Jeff Falin. "Powering today's multi-rail FPGAs and DSPs, Part 1," Analog Applications Journal (1Q 2006).
2. D. Kilani, B. Mohammad, H. Saleh and M. Ismail, "LDO regulator versus switched inductor DC-DC converter," 2014 21st IEEE International Conference on Electronics, Circuits and Systems (ICECS), Marseille, 2014, pp. 638-641.
3. X. Mi, D. Mandal, V. Sathe, B. Bakkologlu and J. Seo, "Fully-integrated switched capacitor voltage regulator with on-chip current-sensing and workload optimization in 32 nm SOI CMOS," 2015 IEEE/ACM International Symposium on Low Power Electronics and Design (ISLPED), Rome, 2015, pp. 140-145.
4. Sae Kyu Lee, David Brooks, and Gu-Yeon Wei. 2012. Evaluation of voltage stacking for near-threshold multicore computing. In Proceedings of the 2012 ACM/IEEE international symposium on Low power electronics and design (ISLPED '12). ACM, New York, N.Y., USA, 373-378.
5. K. M. Fant and S. A. Brandt, "NULL Convention Logic: A Complete and Consistent Logic for Asynchronous Digital Circuit Synthesis," International Conference on Application Specific Systems, Architectures, and Processors, 1996.
6. S. C. Smith and J. Di, Designing Asynchronous Circuits using NULL Convention Logic (NCL), Morgan & Claypool Publishers, 2009.

From these prior references it may be seen that these prior art references are very limited in their teaching and utilization, and an improved asynchronous circuit stacking apparatus and method is needed to overcome these limitations.

SUMMARY OF THE INVENTION

The present invention is directed to an improved electrical circuit using stacking. In accordance with one exemplary embodiment of the present invention, circuit stacking is provided using a higher supply voltage.

The circuit architecture allows low-voltage digital circuit components to be stacked and use a higher supply voltage while operating reliably, thereby reducing the number of voltage converters needed for the system and the accompanied power loss during voltage conversion, which in turn reduce the overall power consumption and enhance battery life.

This invention is a circuit architecture in stacking multiple asynchronous circuit components, more specifically, Multi-Threshold NULL Convention Logic (MTNCL) circuit components, on top of each other, with an overall power supply equal to the multiples of the original VDD, thereby reducing the number of voltage converters needed, which in turn simplifies the power management design and saves power loss during voltage conversion. Leveraging the flexible timing requirement feature of MTNCL, this asynchronous circuit stacking architecture allows the stacked circuits to have different functionalities, different sizes, and different workloads, while maintaining reliable operation. The overhead is minimal compared to the non-stacked designs.

The present invention is useful in battery-powered or energy-harvesting electronic devices, such as mobile computing devices, distributed sensor systems, and Internet-of-Things (IoT) devices.

The advantages include simple implementation, reliably operation, significant power reduction at system level, and no conflict with other power optimization techniques.

These and other objects and advantages of the present invention, along with features of novelty appurtenant thereto, will appear or become apparent by reviewing the following detailed description of the invention.

BRIEF DESCRIPTION OF THE SEVERAL VIEWS OF THE DRAWINGS

In the following drawings, which form a part of the specification and which are to be construed in conjunction therewith, and in which like reference numerals have been employed throughout wherever possible to indicate like parts in the various views.

DETAILED DESCRIPTION OF THE INVENTION

As understood by FIGS. 1 through 11, the present invention provides a stacking method and apparatus. The invention may be understood by examining Asynchronous Logic and Multi-Threshold NULL Convention Logic (MTNCL); Simple MTNCL Circuit Stacking; and Advanced MTNCL Circuit Stacking.

Figure 1:
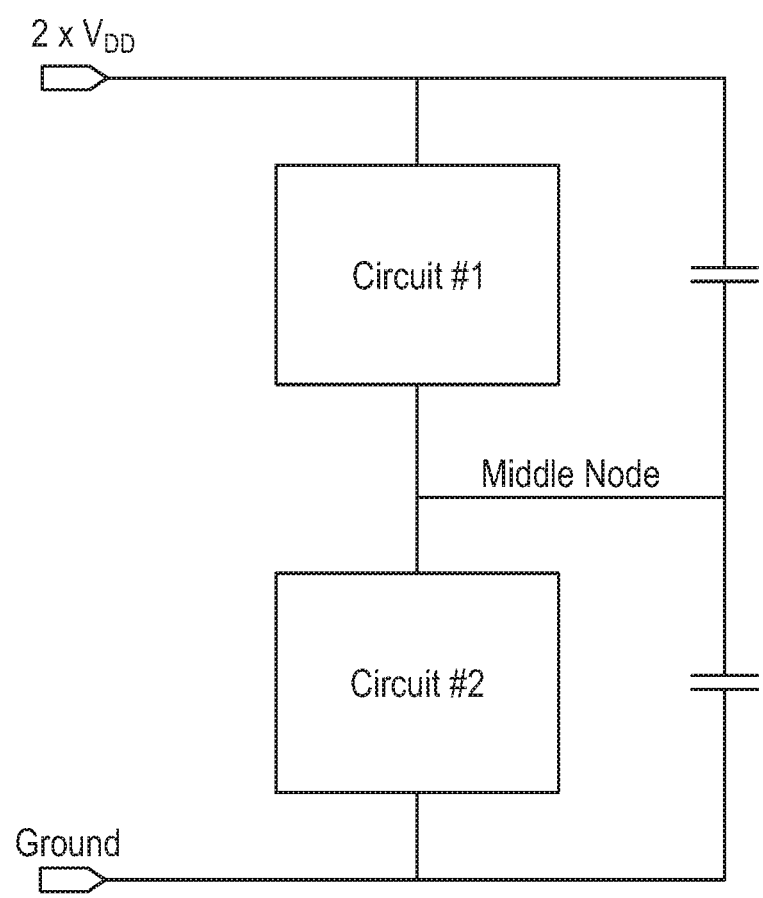
FIG. 1 is a schematic of Circuit Stacking.
Figure 2:
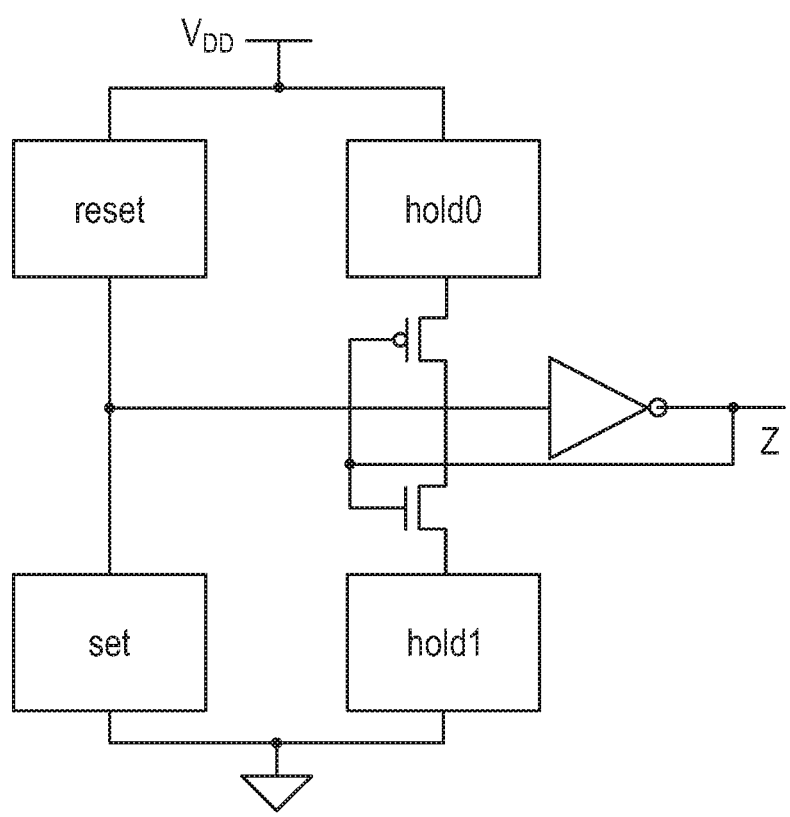
FIG. 2 is a schematic of an NCL Gate General Diagram.

Asynchronous Logic and Multi-Threshold NULL Convention Logic (MTNCL) Asynchronous logic circuits do not have clock; instead, they use handshaking protocols to control the circuit behavior. Different from the bounded-delay counterpart in which gate delays are bounded and the circuit will malfunction if any gate delay exceeds the bound, quasi-delay-insensitive (QDI) style asynchronous circuits, such as the NULL Convention Logic (NCL), do not assume delay bounds. Individual gate or wire delay has no impact on the correctness of the circuit's output. Since signal propagation is not time-dependent, NCL circuits require very little, if any, timing analysis. NCL circuits utilize multi-rail signals to achieve delay-insensitivity. The most prevalent multi-rail encoding scheme is dual-rail. NCL logic family consists of 27 threshold gates, each of which has four blocks to either change or hold the output, as shown in FIG. 2. NCL circuits communicate using request and acknowledge signals to prevent the current DATA from overwriting the previous DATA. With the recent resurgence of asynchronous logic (e.g., IBM TrueNorth neuromorphic processor has 60-70% QDI asynchronous logic), the multi-billion dollar semiconductor industry has been actively looking for asynchronous circuit design technologies to be adopted in commercial products.

Figure 3:
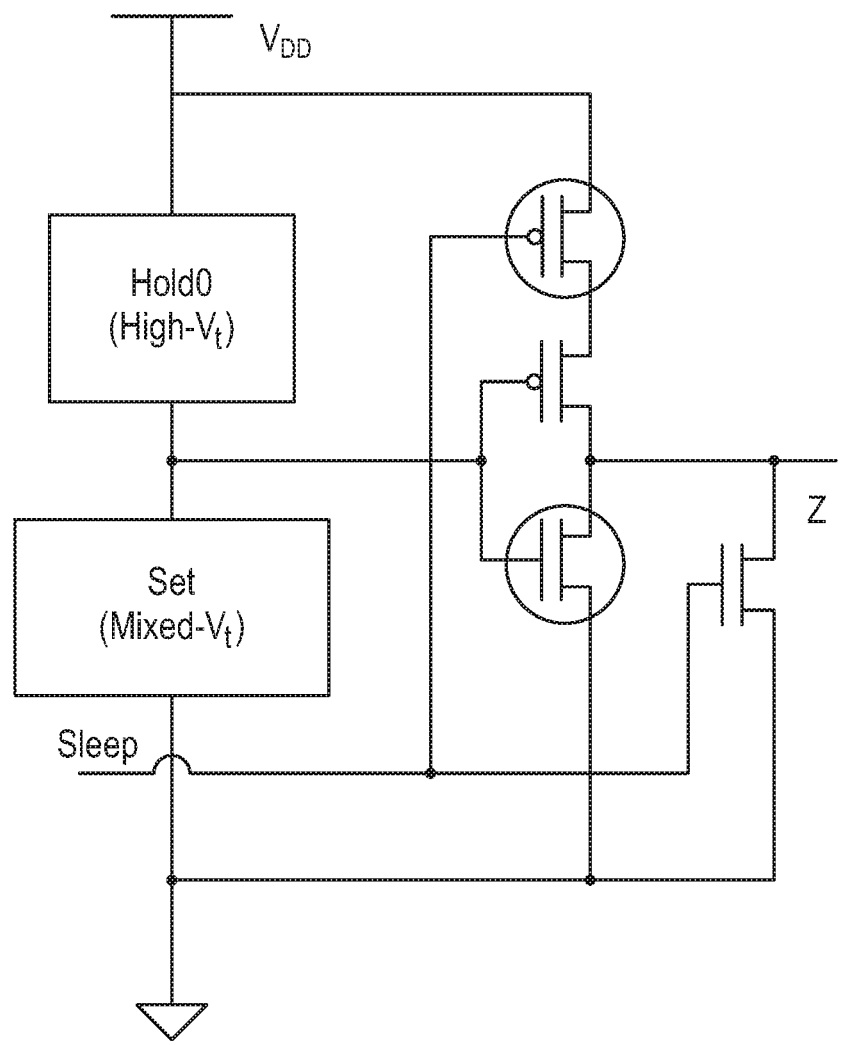
FIG. 3 is a schematic of an MTNCL Gate General Diagram.

In order to reduce the area and power overhead in NCL circuits, MTNCL was invented by implementing MTCMOS power-gating in NCL. MTNCL uses both Low-Vt (fast but leaky) and High-Vt (slow but less leaky) transistors and introduces a sleep function. The static gate implementation in FIG. 3 shows that the Hold0 logic block is all High-Vt transistors for lower leakage. When the sleep signal is de-asserted, the Set logic block uses mostly Low-Vt transistors for faster switching speeds to assert a valid output. After a gate is asserted, it is de-asserted when the sleep signal is enabled, making sure every VDD-GND path has at least one High-Vt transistor that is turned off. MTNCL circuits therefore exhibit significant area reduction and power saving compared to NCL and synchronous counterparts, while maintaining the advantages of QDI asynchronous logic such as timing flexibility and robust operation against process/voltage/temperature variabilities.

Simple MTNCL Circuit Stacking

Figure 4:
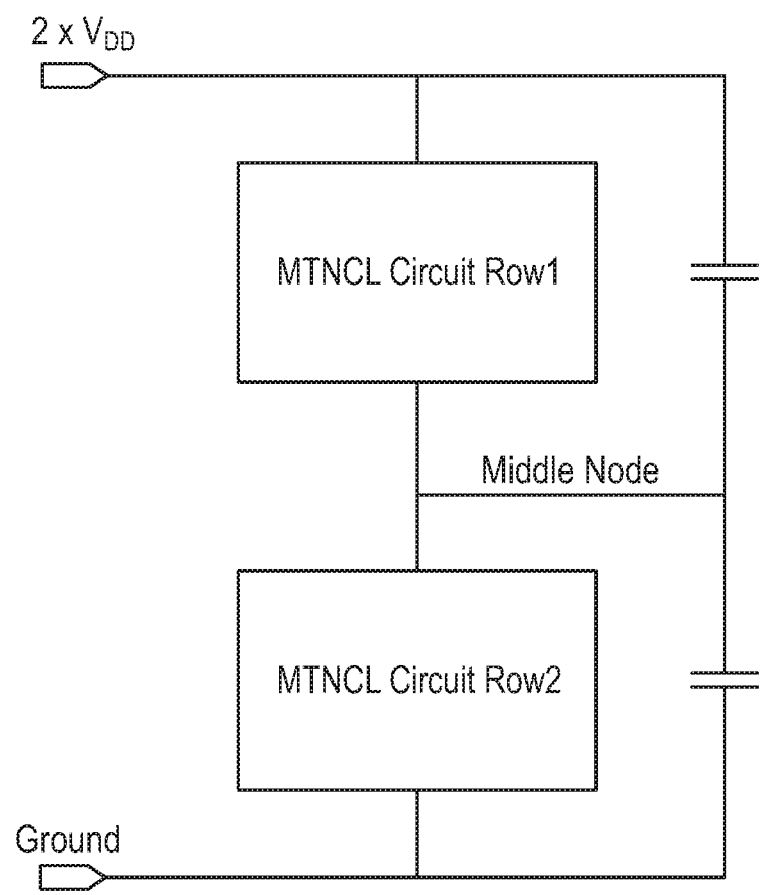
FIG. 4 is a schematic of simple MTNCL Circuit Stacking.
Figure 5:
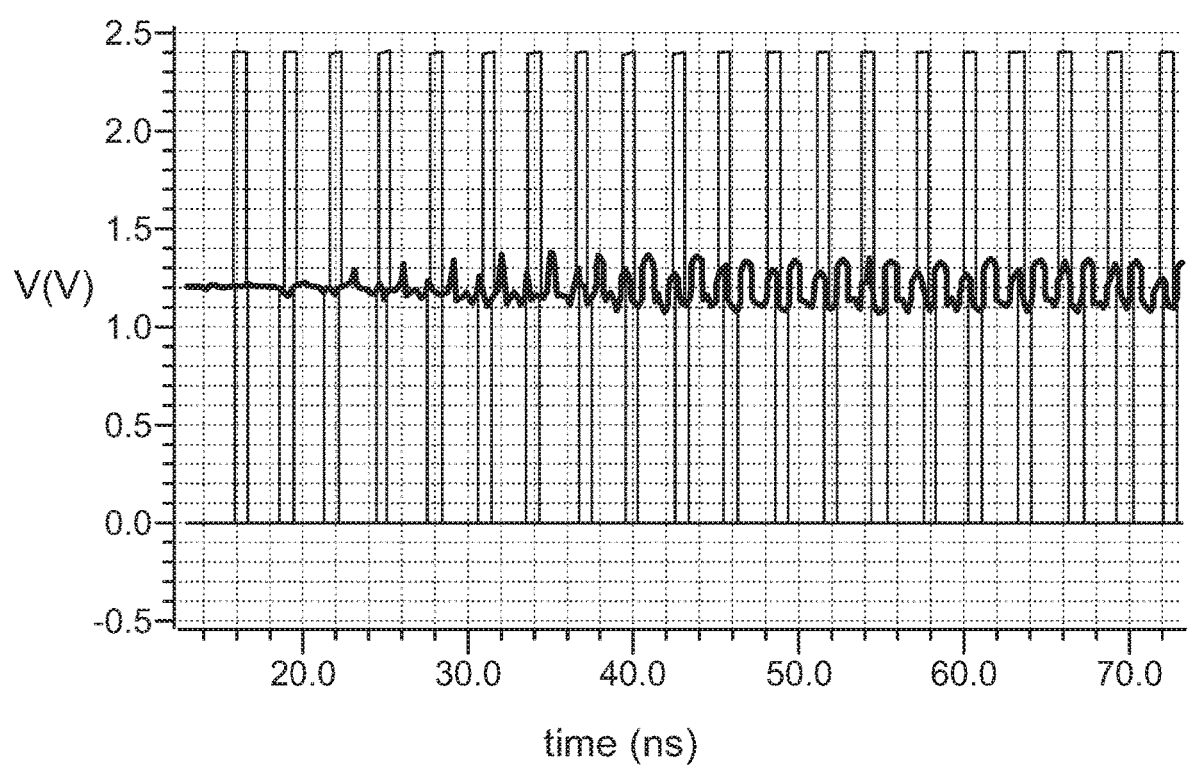
FIG. 5 is a plot simulation of Two Stacked MTNCL Multipliers.
Figure 6:
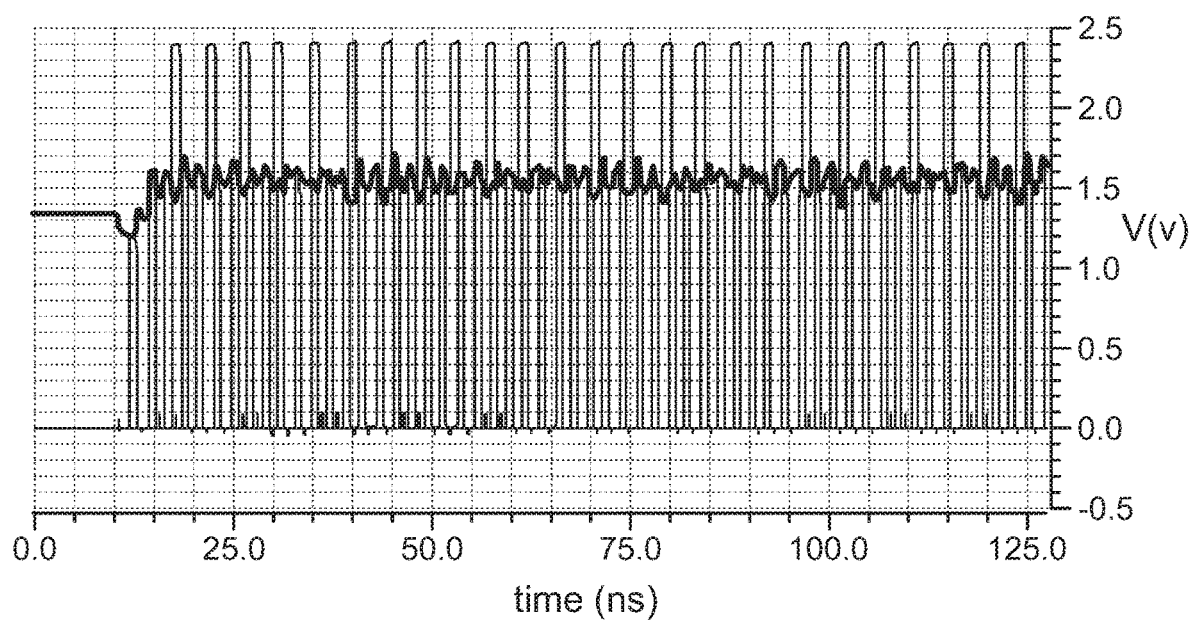
FIG. 6 is a plot simulation of a MTNCL Multiplier Stacked on a RCA.
Figure 7:
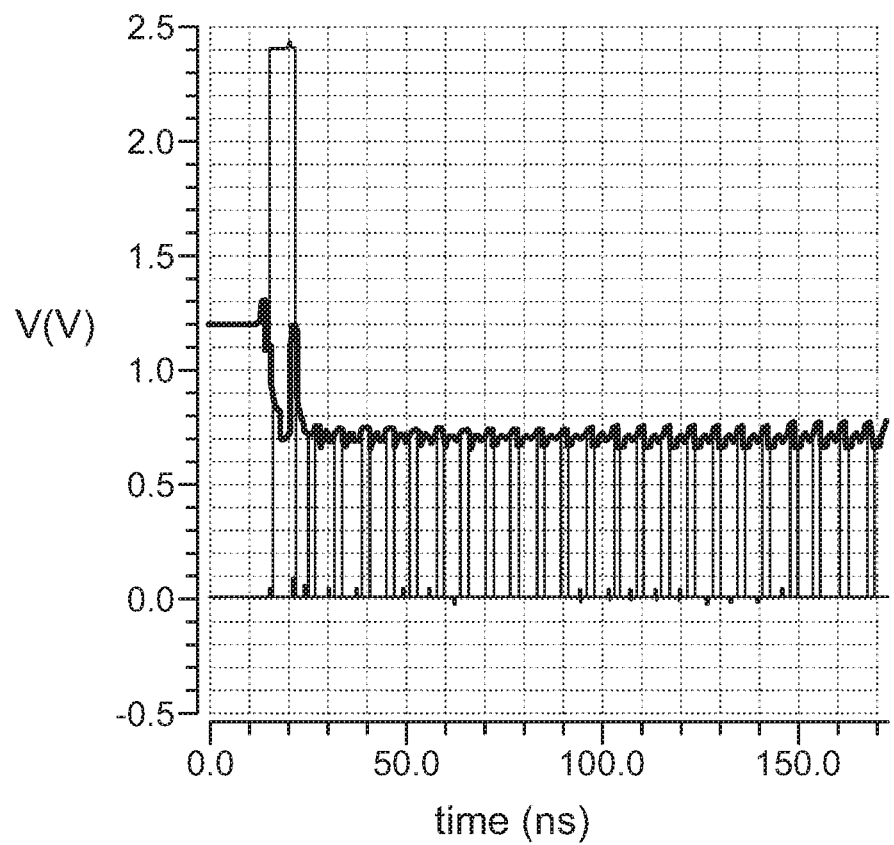
FIG. 7 is a plot simulation of the Simple MTNCL Multiplier-RCA Stack while the Multiplier is Sleeping.

A straightforward implementation of MTNCL circuit stacking is shown in FIG. 4, which is very similar to that of synchronous circuit stacking. Two MTNCL circuit components are stacked on top of each other, with two capacitors connected in parallel. A supply voltage of 2×nominal VDD is applied to the entire stack. Ideally, the middle node voltage should stay at VDD, in order for both circuit components to receive a full VDD dynamic range. Unfortunately, in reality this does not happen. FIG. 5 shows the simulation waveforms of stacking two MTNCL multipliers running the same workload designed in GLOBALFOUNDRIES 130 nm process with the nominal VDD as 1.2V. The waveform in the middle is the middle node voltage, which fluctuates between 1.1V and 1.4V, instead of staying at 1.2V. Such fluctuation will give each multiplier an operating dynamic range between 1.0V and 1.4V, which in turn creates delay and speed changes inside the circuits. Such fluctuations are much worse if stacking different circuits and/or running different workloads. FIG. 6 shows the simulation waveforms of a MTNCL multiplier stacked on a MTNCL ripple-carry-adder (RCA). The waveform indicates that the middle node voltage is biased toward the larger circuit (i.e., the multiplier) and fluctuates between 1.4V and 1.7V, which creates a dynamic range of 0.7V to 1.0V for the multiplier, and a corresponding dynamic range of 1.4V to 1.7V for the RCA. FIG. 7 shows the simulation waveforms of this multiplier-RCA stack when the multiplier on top is sleeping (i.e., does not process data) and the RCA is working. The waveform indicates that the middle node voltage now fluctuates between 0.6V and 0.8V, which is also the dynamic range for the RCA.

Figure 8:
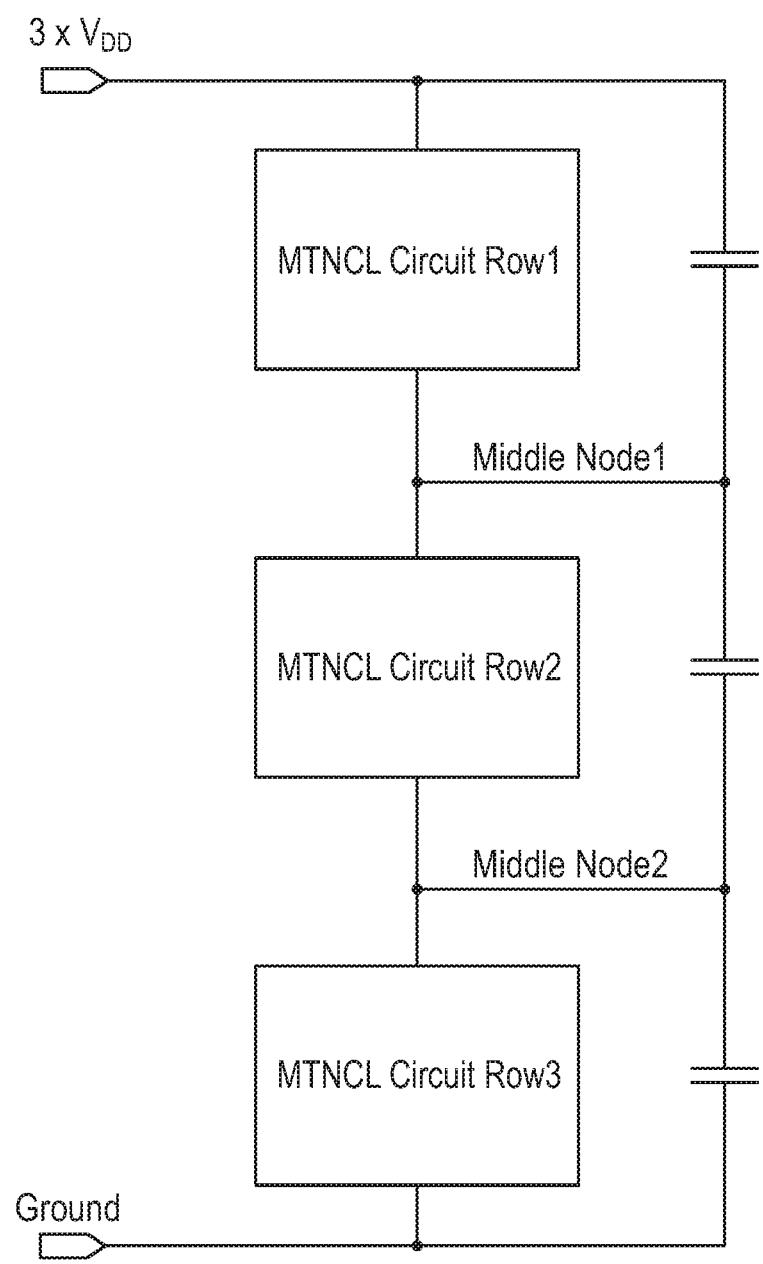
FIG. 8 is a schematic of a simple MTNCL Triple Stacked Implementation.
Figure 9:
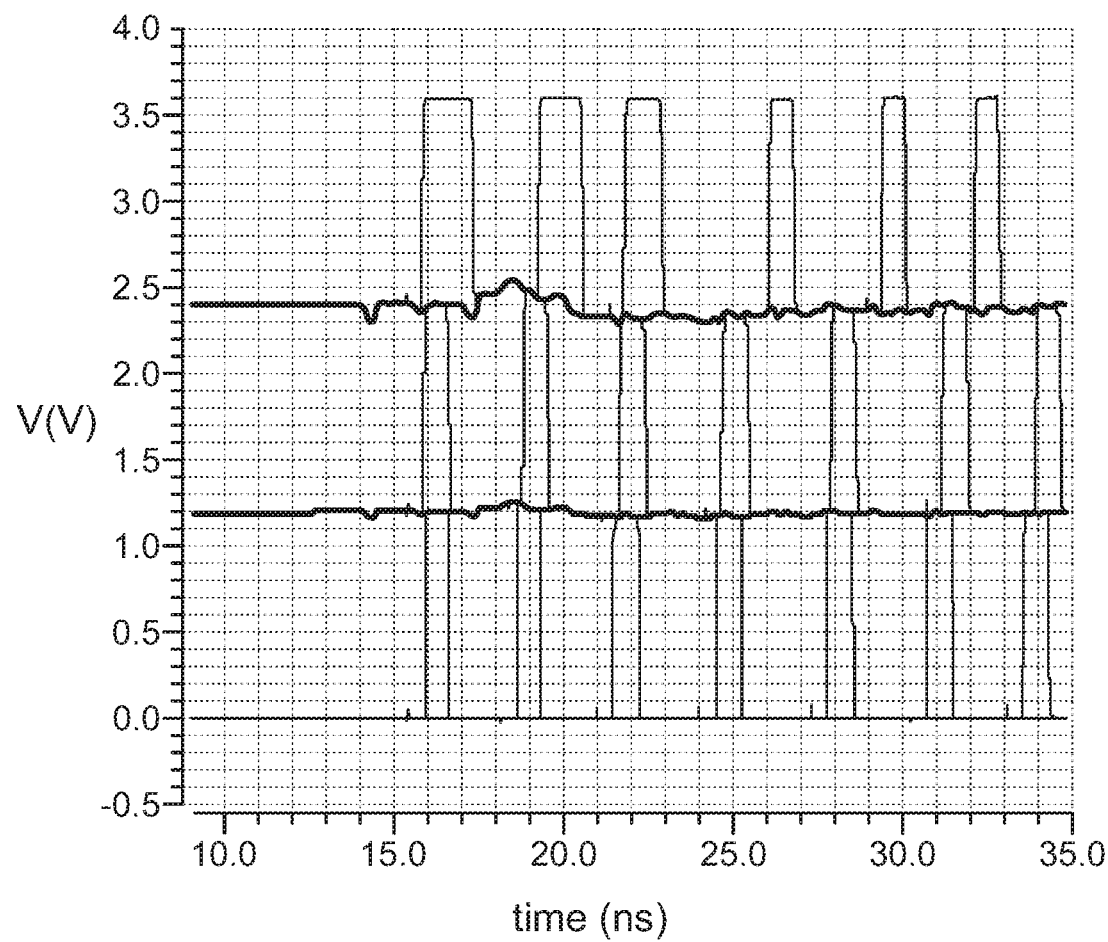
FIG. 9 is a plot simulation of Simple Triple Stacked MTNCL Multipliers.

Three important observations can be made from the discussions above: 1) unlike the stacked synchronous counterparts, despite the fluctuations in the middle node voltage and the dynamic ranges, all stacked MTNCL circuits operate properly. This is mainly due to the timing flexibility of MTNCL, which enables MTNCL circuits to tolerate the delay and speed changes in an autonomous manner. Moreover, the number of stacked MTNCL circuits is not limited to two. FIGS. 8 and 9 demonstrate the proper operation of 3-stack MTNCL multipliers; 2) stacking MTNCL circuits of different sizes will move the middle node voltage toward the larger circuit, creating lower dynamic range for the larger circuit and higher dynamic range for the smaller circuits. Such dynamic range changes slow down the larger circuit and speed up the smaller circuit; and 3) when one circuit is sleeping, the middle node voltage substantially moves toward the working circuit, which severely reduces its dynamic range and slows it down.

Advanced MTNCL Circuit Stacking

Figure 10:
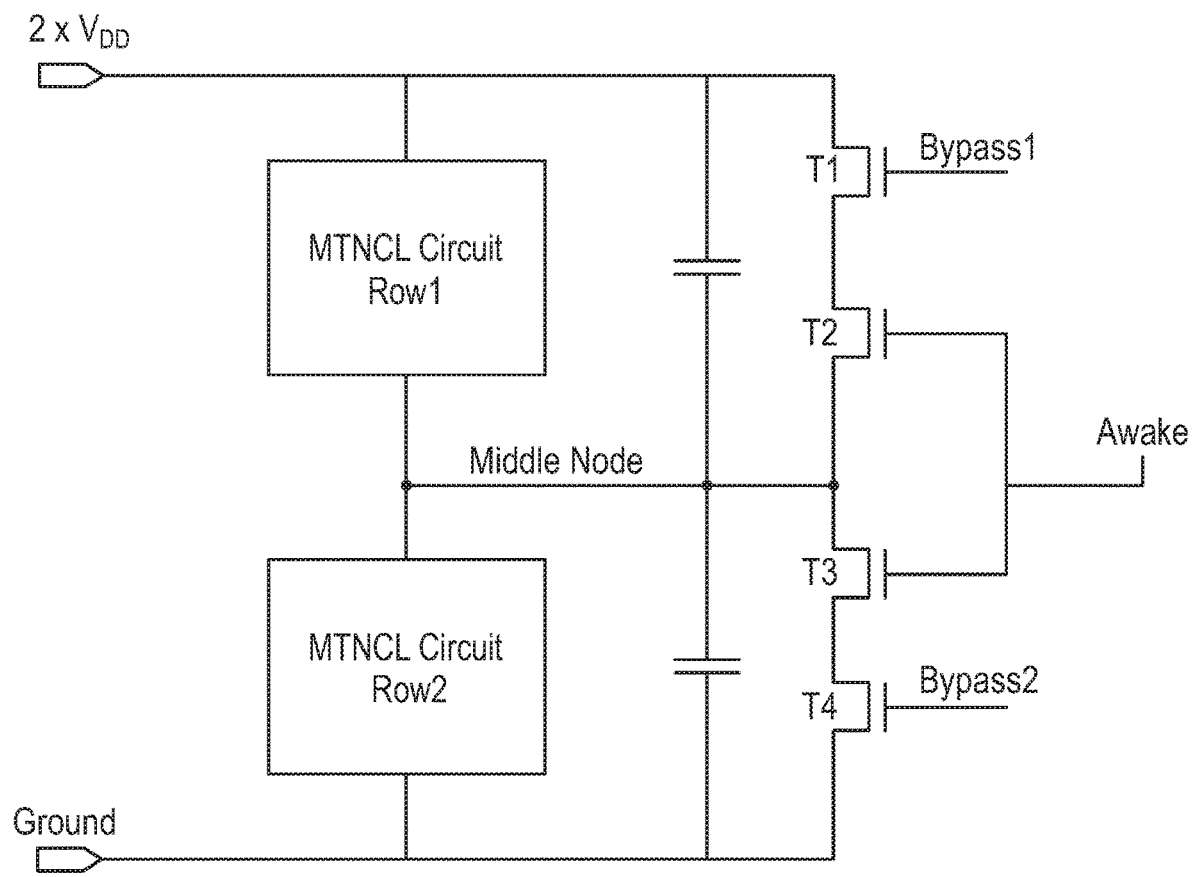
FIG. 10 is a schematic of Advanced MTNCL Circuit Stacking.
Figure 11:
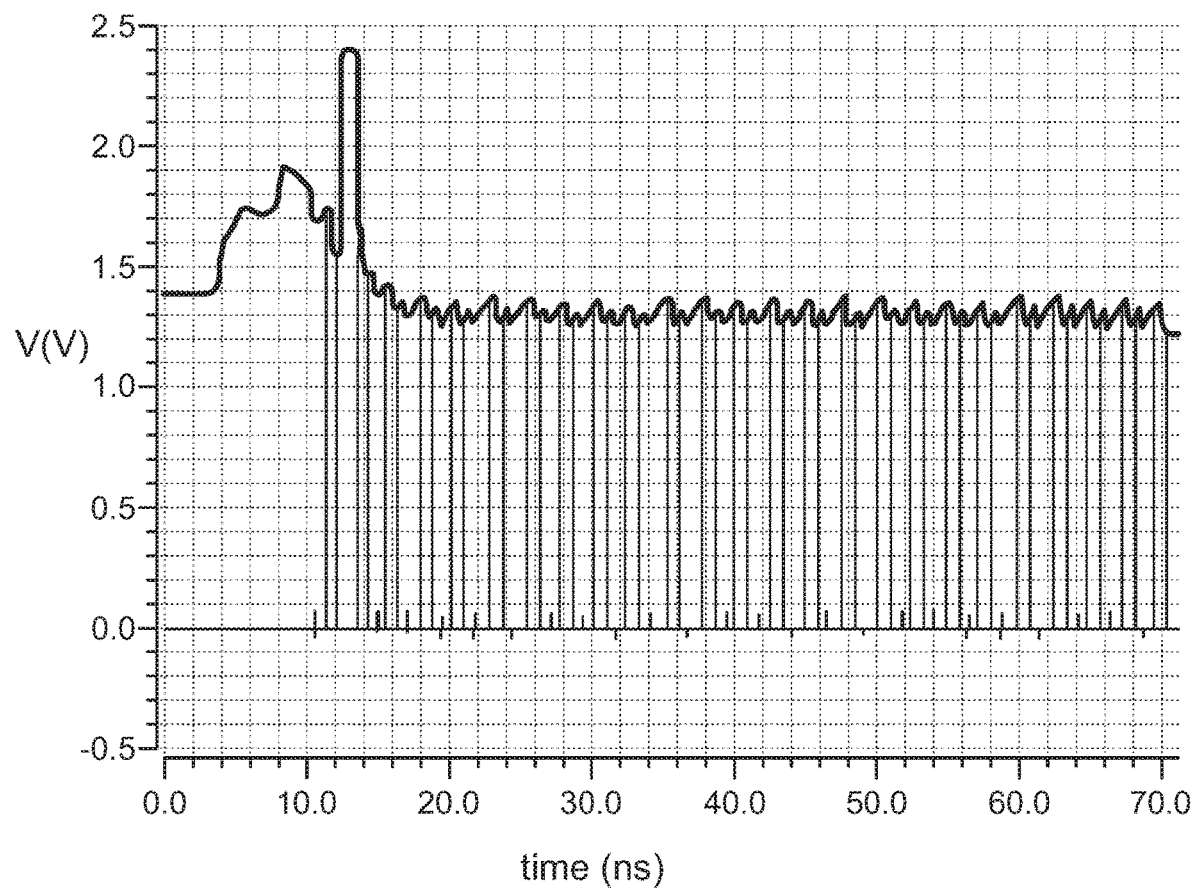
FIG. 11 is a plot simulation of the Advanced MTNCL Multiplier-RCA Stack while the Multiplier is Sleeping.

Although proper and reliable operation is achieved in simple MTNCL circuit stacking, slowing down one or more circuit is apparently undesirable. In order to solve this problem, an advanced MTNCL circuit stacking architecture is shown in FIG. 10, where a set of transistor switches are included to provide extra current paths. When either circuit is running, the Awake signal stays high, turning both the innermost transistors on. If either circuit is put to sleep for an extended period, the respective Bypass signal will also go high, turning the transistor in the same row on and shorting either 2×VDD to the middle node or the middle node to GND. By incorporating this logic, the middle node, which would otherwise shift drastically towards the working circuit, can be pulled in the opposite direction, thereby increasing the dynamic range and speed for the working circuit. The Awake signal is set low when both circuits are put to sleep for an extended period, thereby blocking the direct path from VDD to GND. The effectiveness of this solution is clearly shown in FIG. 11, in which the voltage of the middle node is pulled back to around VDD (1.2V) when the top multiplier is sleeping and the bottom RCA is working. The control signals of these transistor switches come from the system-level controller, which knows the system status to determine when any of these circuits should be sleeping or working. The overhead of advanced MTNCL circuit stacking is minimal: schematic simulations show <2% power overhead compared to the non-stacked counterpart, while physical simulations (i.e., after parasitic extraction) shows <6% overhead, without any performance penalty. Considering the 60% to 82% efficiency of on-chip buck converters, even if only one voltage converter can be removed by adopting MTNCL circuit stacking, the power saving is still much more significant than the overhead.

Schematic simulations and physical simulations (i.e., after parasitic extraction) have been conducted for both simple and advanced MTNCL circuit stacking in both GLOBALFOUNDRIES 130 nm bulk CMOS process and 32 nm silicon-on-insulator (SOI) process. All simulation results demonstrate the same conclusions: 1) stacked MTNCL circuits are able to tolerate the speed fluctuations and operate reliably in all conditions; 2) advanced MTNCL circuit stacking is able to maintain the dynamic range and performance of the circuits in the stack under all working conditions; 3) the overhead is minimal compared to the power savings from reducing the number of voltage converters needed.

From the foregoing, it will be seen that this invention well adapted to obtain all the ends and objects herein set forth, together with other advantages which are inherent to the structure. It will also be understood that certain features and sub-combinations are of utility and may be employed without reference to other features and sub-combinations. This is contemplated by and is within the scope of the claims. Many possible embodiments may be made of the invention without departing from the scope thereof. Therefore, it is to be understood that all matter herein set forth or shown in the accompanying drawings is to be interpreted as illustrative and not in a limiting sense.

When interpreting the claims of this application, method claims may be recognized by the explicit use of the word 'method' in the preamble of the claims and the use of the 'Mg' tense of the active word. Method claims should not be interpreted to have particular steps in a particular order unless the claim element specifically refers to a previous element, a previous action, or the result of a previous action. Apparatus claims may be recognized by the use of the word 'apparatus' in the preamble of the claim and should not be interpreted to have 'means plus function language' unless the word 'means' is specifically used in the claim element. The words 'defining,' 'having,' or 'including' should be interpreted as open ended claim language that allows additional elements or structures. Finally, where the claims recite "a" or "a first" element of the equivalent thereof, such claims should be understood to include incorporation of one or more such elements, neither requiring nor excluding two or more such elements.

What is claimed is:

1. A stacked asynchronous circuit receiving an input voltage from a first terminal and a second terminal, an awake signal, first bypass signal, and a second bypass signal, the circuit comprising:
a first asynchronous circuit connect to the first terminal;
a middle node connected to the first asynchronous circuit;
a second asynchronous circuit connected to the middle node;
the second asynchronous circuit connected to the second terminal;
a first capacitor connected to the first terminal and the middle node;
a second capacitor connected to the second terminal and the middle node;
a first bypass transistor and a first awake transistor connected in series between the first terminal and the middle node, the first bypass transistor receiving the first bypass signal, the first awake transistor receiving the awake signal;
a second bypass transistor and a second awake transistor connected in series between the second terminal and the middle node, the second bypass transistor receiving the second bypass signal, the second awake transistor receiving the awake signal.

2. The circuit of claim 1, further comprising:
the first asynchronous circuit including a multi-threshold null convention logic circuit.

3. The circuit of claim 1, further comprising:
the second asynchronous circuit including a multi-threshold null convention logic circuit.

4. The circuit of claim 2, further comprising:
the second asynchronous circuit including a multi-threshold null convention logic circuit.

* * * * *